United States Patent [19]
Conboy et al.

[11] Patent Number: 5,924,833
[45] Date of Patent: Jul. 20, 1999

[54] AUTOMATED WAFER TRANSFER SYSTEM

[75] Inventors: Michael R. Conboy, Austin, Tex.;
Gerald L. Goff, Reichenberg, Germany;
Elfido Coss, Jr., Austin, Tex.

[73] Assignee: Advanced Micro Devices, Inc.

[21] Appl. No.: 08/878,788

[22] Filed: Jun. 19, 1997

[51] Int. Cl.[6] .................................. B65G 49/07
[52] U.S. Cl. .................. 414/217; 414/939; 414/940
[58] Field of Search .................... 414/217, 937, 414/938, 939, 940

[56] References Cited

U.S. PATENT DOCUMENTS

| | | | |
|---|---|---|---|
| 4,923,352 | 5/1990 | Tamura et al. | 414/940 X |
| 4,964,776 | 10/1990 | Wakita et al. | 414/940 X |
| 5,024,570 | 6/1991 | Kiriseko et al. | 414/937 X |
| 5,033,927 | 7/1991 | Pelissier | 414/217 |
| 5,139,459 | 8/1992 | Takahashi et al. | 414/939 X |
| 5,163,832 | 11/1992 | Ishii et al. | 414/940 X |
| 5,303,214 | 4/1994 | Kulakowski et al. | 369/34 |
| 5,451,131 | 9/1995 | Hecht et al. | 414/940 X |
| 5,570,990 | 11/1996 | Bonora et al. | 414/940 X |
| 5,658,123 | 8/1997 | Goff et al. | 414/217 X |
| 5,664,925 | 9/1997 | Muka et al. | 414/937 X |
| 5,730,573 | 3/1998 | Masujima et al. | 414/939 X |
| 5,751,581 | 5/1998 | Tau et al. | 364/468.22 |
| 5,772,386 | 6/1998 | Mages et al. | 414/937 X |

FOREIGN PATENT DOCUMENTS

| | | | |
|---|---|---|---|
| 552756 | 7/1993 | European Pat. Off. | 414/940 |
| 6069312 | 3/1994 | Japan | 414/940 |
| 6104326 | 4/1994 | Japan | 414/939 |

*Primary Examiner*—James W. Keenan
*Attorney, Agent, or Firm*—Kevin L. Daffer; Robert C. Kowert; Conley, Rose & Tayon

[57] ABSTRACT

An automated system is presented for containerless transfer of semiconductor wafers through a wall separating a first fabrication area and a second fabrication area. The system includes multiple containers for transporting the wafers, one or more air lock chambers, mass transfer systems, robotic arms, stock areas, and a control system. The containers (e.g., wafer boats) are dispersed between the first and second fabrication areas. A portion of the containers contain at least one semiconductor wafer, and the remainder of the containers are empty. The air lock chambers are positioned in sealed openings in the wall. The air lock chambers provide isolation between the first and second fabrication areas while permitting the transfer of semiconductor wafers between the fabrication areas. A mass transfer system is positioned within each air lock chamber and allows for containerless transfer of wafers through the air lock chamber. The stock areas provide storage areas for containers adjacent to each air lock chamber. The robotic arms are used to move the containers between the stock areas and each air lock chamber. The control system governs the dispersal of containers and the operations of the air lock chambers, the mass transfer systems, the robotic arms, and the stock areas.

12 Claims, 3 Drawing Sheets

AUTOMATED WAFER TRANSFER SYSTEM

BACKGROUND OF THE INVENTION

1. Field of the Invention

This invention relates to integrated circuit manufacture and more particularly to a system for transferring semiconductor wafers through a barrier between fabrication areas without transferring, through the barrier, the container which holds the wafers.

2. Description of the Relevant Art

An integrated circuit consists of electronic devices electrically coupled by conducting traces called interconnects. Interconnects are patterned from conducting layers formed on the surface of a semiconductor wafer. The ability to form stacked layers of interconnects has allowed more complex circuits to be implemented in and on relatively small surface areas of silicon substrates. The individual interconnect levels of multilevel interconnect structures are separated by layers of electrically insulating materials (i.e., interlevel dielectric layers).

As the number of interconnect levels is increased, the stacking of additional interconnect layers on top of one another tends to produce greater elevational disparity on the resulting surface topography. Problems of step coverage of a conductive layer upon the rugged topography oftentimes renders trace conductors inoperable or at least unreliable. In additional to step coverage problems, large disparity of the surface topography leads to depth of focus problems during photolithographic patterning of the conductive film to form trace conductors. Abrupt elevational changes in the topography of a semiconductor wafer typically occur at edges of patterned layers such as interconnects. The tendency of layers formed on the surface of a semiconductor wafer to be thinner over steps is referred to as the step coverage problem. A major factor in the processing of integrated circuits with submicron device dimensions is the limited depth of focus of the optical steppers used to pattern circuit features. In order to obtain maximum resolutions, imaging surfaces must be fairly planar with a suitable elevational disparity less than about ±0.5 microns. Accordingly, interlevel dielectric planarization techniques must be employed in order to make imaging surfaces substantially planar.

Chemical mechanical polish (CMP) is a popular method of planarizing the upper surface of an interlevel dielectric layer. CMP combines chemical etching and mechanical buffing to remove raised features on a surface of a semiconductor wafer. In a typical CMP process, a semiconductor wafer is mounted on a rotating holder and lowered onto a rotating surface flooded with a mild etchant solution, generally defined as a silica slurry. The etchant grows a thin layer on the exposed wafer surface that is almost simultaneously removed by the buffing action. The net effect is a very controlled polishing process capable of incredible flatness.

One problem with CMP techniques is that they produce large amounts of contaminants, including particulates, metallic ions, and chemical substances. The destructive effects of those contaminants is readily apparent in the overall performance of VLSI or ULSI devices. Any contaminants attributed to the slurry, chemical reactant, or buff/etch byproduct, which is thereafter introduced into other fabrication operations, severely compromises the success of those operations. For example, ingress of contaminants from the CMP operation to the thermal furnaces used for growing oxide, or to the chambers used for implanting ions, would negatively impact the resultant grown oxide or junction profile.

Without adequately preventing deposition of CMP-derived contaminants on semiconductor wafers undergoing other fabrication operations, CMP, as an interlevel dielectric planarization method, cannot be successfully used. One way to minimize deposition of CMP-derived contaminants on semiconductor wafers undergoing other (i.e., non-CMP) fabrication operations would be to perform the CMP process in an area hermetically sealed from other fabrication areas. Maintaining separate the CMP area from the other fabrication areas begins by installing a wall between those areas. Wafers must, however, be transported between the respective areas so that CMP can be incorporated within the process flow.

Transport of wafers between CMP and non-CMP areas entails passing the wafers through a door separating the areas. The door, depending upon sophistication, can be a load lock chamber adapted for passing a wafer-containing container. The wafer or wafers are transported in the container through the chamber from one area to another area. The load lock comprises an air circulation and filtration system which effectively flushes the ambient air surrounding the wafers. Unfortunately, however, the load lock by itself cannot in most instances remove contaminants from the surface of wafer-containing containers. The containers pick up contaminants while in the CMP fabrication area. When the containers passes through the load lock unit, those contaminants are not always flushed from the containers in the load lock. As a result, containers passed from one area to another may have contaminants clinging to them which may come loose and find their way onto the wafers.

It is therefore desirable to minimize the opportunity for a contaminated container from passing to and from a CMP area. An effective method of preventing passage of container-entrained contaminants into what should be a "clean room" environment from a relatively dirty CMP room is to pass only the wafers and not the containers in which they reside.

Robotic arms are now available which are able to accomplish many tedious and repetitive tasks previously performed by humans. Unlike a human, however, a robotic arm tirelessly performs such a task the same way every time, reducing variability in both the end result and the amount of time required to accomplish the task. The use of one or more robotic arms in a manufacturing process thus adds an element of predictability to the process.

It is therefore desirable to have an automated wafer transfer system which provides isolation between fabrication areas requiring different contamination control levels, yet provides for the transfer of semiconductor wafers between the fabrication areas. The wafer transfer system should pass only the semiconductor wafers from one fabrication area to another, and not the containers used to hold those wafers. The wafer transfer system should also be automated to reduce variability characteristic of manual operations

SUMMARY OF THE INVENTION

The problems outlined above are in large part solved by an automated system for containerless transfer of semiconductor wafers through a wall separating a first fabrication area and a second fabrication area. The system includes multiple containers for transporting the wafers, one or more air lock chambers, mass transfer systems, robotic arms, stock areas, and a control system. The containers (e.g., wafer boats) are dispersed between the first and second fabrication areas. A portion of the containers contain at least one semiconductor wafer, and the remainder of the containers are empty. The air lock chambers provide isolation between the first and second fabrication areas while permitting the transfer of semiconductor wafers between the fabrication areas. A mass transfer system is positioned within each air lock chamber and allows for containerless transfer of wafers through the air lock chamber. The stock areas provide storage areas for containers adjacent to the air lock chamber. The robotic arms are used to move the containers between the stock areas and the air lock chamber. The control system governs the dispersal of containers and the operations of the air lock chambers, the mass transfer systems, the robotic arms, the mass transfer systems, and the stock areas.

The air lock chambers are positioned within sealed openings in a wall separating the first fabrication area from the second fabrication area. Each air lock chamber includes a first door and a second door arranged on opposed surfaces of the air lock chamber and dimensioned to allow containers to pass therethrough. The first door separates the first fabrication area from the air lock chamber, and the second door separates the second fabrication area from the air lock chamber. The first fabrication area is hermetically sealed from the second fabrication area during times when either the first door or the second door is closed. In order to prevent the transfer of contaminants between the fabrication areas, the air pressure within each air lock chamber is maintained at a level higher than the air pressure levels within the first and second fabrication areas.

Each mass transfer system within a corresponding air lock chamber includes a temporary wafer storage location. During a first portion of a wafer transfer operation, the mass transfer system involved removes one or more semiconductor wafers from a first wafer-containing container and stores the one or more wafers within the temporary storage location. During a second portion of the wafer transfer operation, the mass transfer system removes the wafers from the temporary storage location and positions the wafers within an empty second container.

Each stock area is positioned adjacent to an air lock chamber. Each stock area has one or more input ports for receiving containers, one or more output ports for providing containers, an empty container storage area, and a non-empty container storage area. Each stock area receives a container at one of the input ports, stores the container within either the empty container storage area or the non-empty container storage area as appropriate, and provides a stored container at one of the output ports.

Each robotic arm is positioned between an air lock chamber and an adjacent stock area, and is used to move containers between the air lock chamber and the adjacent stock area. In a preferred embodiment, each robotic arm includes an articulated mechanical arm and a vehicle. The mechanical arm is mounted upon an upper surface of the vehicle, and the vehicle moves along a set of rails. The mechanical arm includes a mechanical hand for grasping a container, and is capable of extension and retraction along a longitudinal axis, rotation about the longitudinal axis, and rotation about a vertical axis through the center of the vehicle.

During a transfer of a container containing one or more wafers from the first fabrication area to the second, the control system directs the movement of the wafer-containing container to a first stock area located within the first fabrication area and adjacent to the air lock chamber to be used during the transfer operation. The control system also directs the pre-positioning of an empty container within a second stock area located within the second fabrication area and adjacent to the air lock chamber.

A first robotic arm located between the first stock area and the air lock chamber receives the wafer-containing container from the first stock area. The first door of the air lock chamber is opened, and the first robotic arm places the wafer-containing container within the mass transfer system. The mass transfer system removes the wafers from the container and places the wafers in the temporary storage location. The first robotic arm then removes the container, now empty, from the air lock chamber, and the first door is closed. The first robotic arm delivers the empty container to an input port of the first stock area. The first stock area stores the empty container within the empty container storage area.

Both the first and second doors of the air lock chamber are now closed. A period of time is allowed to elapse within which all of the air present within the air lock chamber is exhausted and replaced by filtered supply air. In the preferred embodiment, this amount of time is about 30 seconds. This purging step helps prevent any airborne contaminants introduced into the air lock chamber from the first fabrication area when the first door was open from being transferred to the second fabrication area when the second door is subsequently opened.

While the air lock chamber is being purged, a second robotic arm located between the second stock area and the air lock chamber receives the pre-positioned empty container from the second stock area. The second door of the air lock chamber is opened, and the second robotic arm places the empty container within the mass transfer system. The mass transfer system removes the wafers from the temporary storage location and positions the wafers within the container. The second robotic arm then removes the container, now containing the wafers, from the air lock chamber, and the second door is closed. The second robotic arm delivers the wafer-containing container to an input port of the second stock area. The second stock area stores the wafer-containing container within the non-empty container storage area.

BRIEF DESCRIPTION OF THE DRAWINGS

Other objects and advantages of the invention will become apparent upon reading the following detailed description and upon reference to the accompanying drawings in which.

Figure 1:
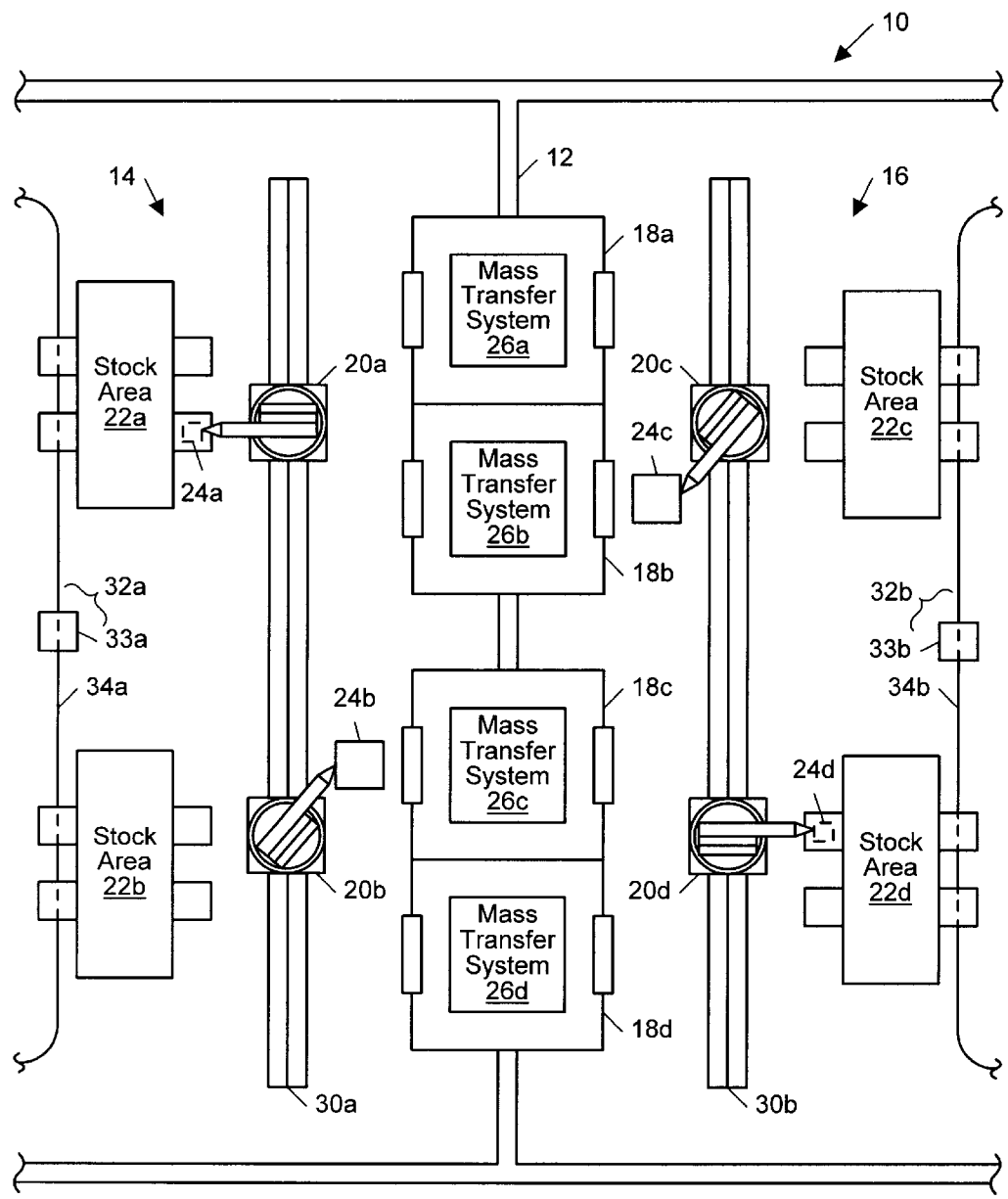
FIG. 1 is a top plan view of a preferred embodiment of an automated wafer transfer system of the present invention, wherein the automated wafer transfer system includes four air lock chambers, four robotic arms, and four stock areas.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 1 is a top plan view of a preferred embodiment of an automated wafer transfer system 10 of the present invention. Automated wafer transfer system 10 performs containerless transfer of semiconductor wafers through a wall 12 between a first fabrication area 14 and a second fabrication area 16. First fabrication area 14 and second fabrication area 16 may have different contamination control requirements. First fabrication area 14 may be, for example, a photolithography processing area with stringent contamination control requirements, and second fabrication area 16 may be, for example, a chemical mechanical polish (CMP) processing area with much less stringent contamination control requirements. Advantages of performing wafer transfer operations automatically rather than manually include less variability in the amount of time required, less contamination introduced during the transfer operation, and less potential for wafer damage.

Automated wafer transfer system 10 includes four air lock chambers 18a–d, four robotic arms 20a–d, and four stock areas 22a–d. Each air lock chamber 18 is positioned within a sealed opening in wall 12, and provides the ability to transfer semiconductor wafers between first fabrication area 14 and second fabrication area 16. Containers 24a–d (e.g., wafer boats) are associated with a given fabrication area and are used to transport semiconductor wafers within that fabrication area. Air lock chambers 18a–d include mass transfer systems 26a–d, respectively, which eliminate the need to transfer containers with the wafers. Containers 24a–d thus remain within their respective fabrication areas during wafer transfer operations, and any contaminants clinging to containers 24a–d are not transferred with the wafers from one fabrication area into the other. In addition, the air within each air lock chamber 18 is purged during wafer transfer operations, significantly reducing the number of airborne contaminants transferred from one fabrication area into the other. Thus during operation, each air lock chamber 18 provides a high level of isolation between first fabrication area 14 and second fabrication area 16.

Stock areas 22a–d are used to store containers. The containers may either be empty or contain wafers. Robotic arms 20a–d are positioned between air lock chambers 18a–d and stock areas 22a–d and are used to transfer containers between air lock chambers 18a–d and stock areas 22a–d. Robotic arms 20a–b preferably move along a first set of parallel rails 30a, and robotic arms 20c–d preferably move along a second set of parallel rails 30b.

A transportation system 32a is used to transport semiconductor wafers within first fabrication area 14. Transportation system 32a includes a transport car 33a. Transport car 33a delivers containers to stock areas 22a–b and receives containers from stock areas 22a–b. Transport car 33a is preferably mounted upon a first single rail 34a and moves along a closed path within first wafer fabrication area 14. A similar transportation system 32b exists within second fabrication area 16, and includes a transport car 33b. Transport car 33b preferably moves along a second single rail 34b. Transport car 33b delivers containers to stock areas 22c–d and receives containers from stock areas 22c–d.

Figure 2:
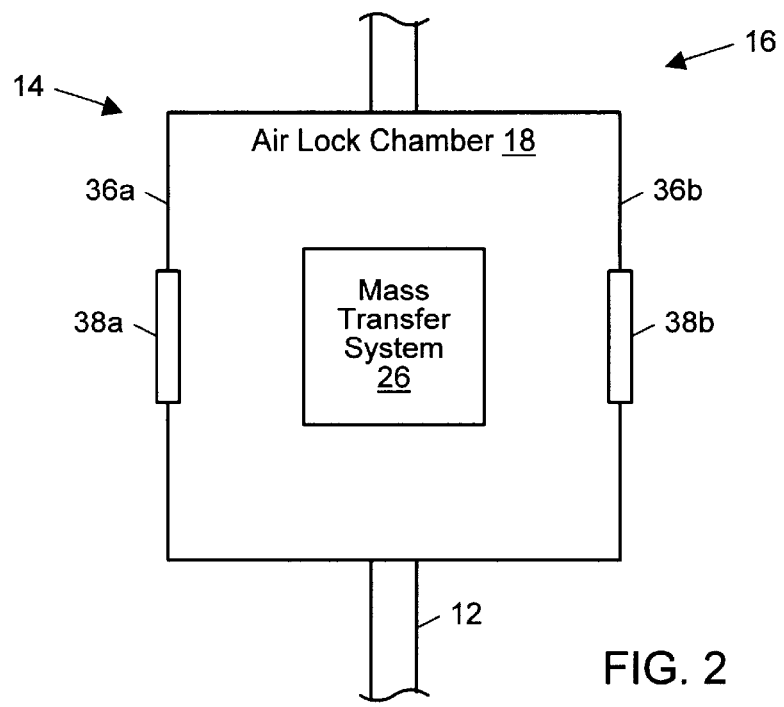
FIG. 2 is a top plan view of a preferred embodiment of each air lock chamber of FIG. 1.

FIG. 2 is a top plan view of a preferred embodiment of each air lock chamber 18. Each air lock chamber 18 has two opposed operational sides 36a–b. Operational side 36a is in first fabrication area 14 on one side of wall 12, and operational side 36b is in second fabrication area 16 on the other side of wall 12. A door 38a in operational side 36a allows access to the interior of air lock chamber 18 from first fabrication area 14, and a door 38b in operational side 36b allows access to the interior of air lock chamber 18 from second fabrication area 16. During operation, doors 38a–b preferably move inward toward the interior of air lock chamber 18 just enough to clear the corresponding door openings, then are lowered by associated door positioning mechanisms along the vertical surfaces of respective operational sides 36a–b inside air lock chamber 18. Seals located between doors 38a–b and the corresponding door openings prevent air from entering or leaving air lock chambers 18 through voids between the edges of the doors and the door openings when the doors are closed. The seals are preferably attached to the outer rims of doors 38a–b and are pneumatic. The seals are inflated with air when the doors are closed and deflated prior to the doors being opened. Doors 38a–b are also preferably coupled to an interlock mechanism which prevents doors 38a–b from being open at the same time. Suitable air lock chamber components, including the doors and sealing mechanisms, are available from the Meissner & Wurst Co., Anaheim, Calif.

It is noted that doors 38a–b may be coupled to the respective operational sides 36a–b of corresponding air lock chamber 18 by hinges which allow the doors to swing open. Alternately, doors 38a–b may be coupled to the respective operational sides 36a–b by two or more rails which allow the doors to first clear the door openings, then slide open along the rails.

After each air lock chamber 18 is installed in a corresponding opening within wall 12, a sealing material is used to fill all voids between air lock chamber 18 and wall 12. Contaminants are thus prevented from traveling between first fabrication area 14 and second fabrication area 16 through voids around air lock chambers 18a–d. It is noted that air lock chambers 18a–d may be positioned in the corresponding openings in wall 12 in any manner which allows operational side 36a to be located in sealed ambient communication with first fabrication area 14 and operational side 36b to be located in sealed ambient communication with second fabrication area 16.

Filtered supply air is preferably supplied to each air lock chamber 18 through a top surface of the air lock chamber, and air within each air chamber 18 is preferably exhausted through a bottom surface of the air lock chamber. The filtered supply air preferably flows downward into the interior of each air lock chamber 18 in a smooth fashion and without turbulence, creating a vertical laminar flow of filtered air within each air lock chamber 18. The flows of filtered supply air and exhaust air are maintained such that the air pressure within each air lock chamber 18 is always greater than the air pressures within both first fabrication area 14 and second fabrication area 16. Maintaining this positive air pressure with respect to both first fabrication area 14 and second fabrication area 16 prevents airborne particulates within first fabrication area 14 and second fabrication area 16 from entering air lock chamber 18. Airborne particulates cannot travel between first fabrication area 14 and second fabrication area 16 through air lock chambers 18a–d as they are not able to enter air lock chambers 18a–d.

Air lock chambers 18a–d contain respective mass transfer systems 26a–d. Each mass transfer system 26 provides an automated means of unloading semiconductor wafers from containers and loading semiconductor wafers into containers. Each mass transfer systems 26 includes a temporary storage location for storing semiconductor wafers inside the corresponding air lock chamber 18. Suitable mass transfer systems are available from the Fortrend Engineering Corporation, Sunnyvale, Calif. Suitable containers (i.e., wafer boats) for use with mass transfer systems made by Fortrend Engineering Corporation are model number KA200-80MDA-47C02 manufactured by Fluoroware, Inc., Chaska, Minn.

Figure 3:
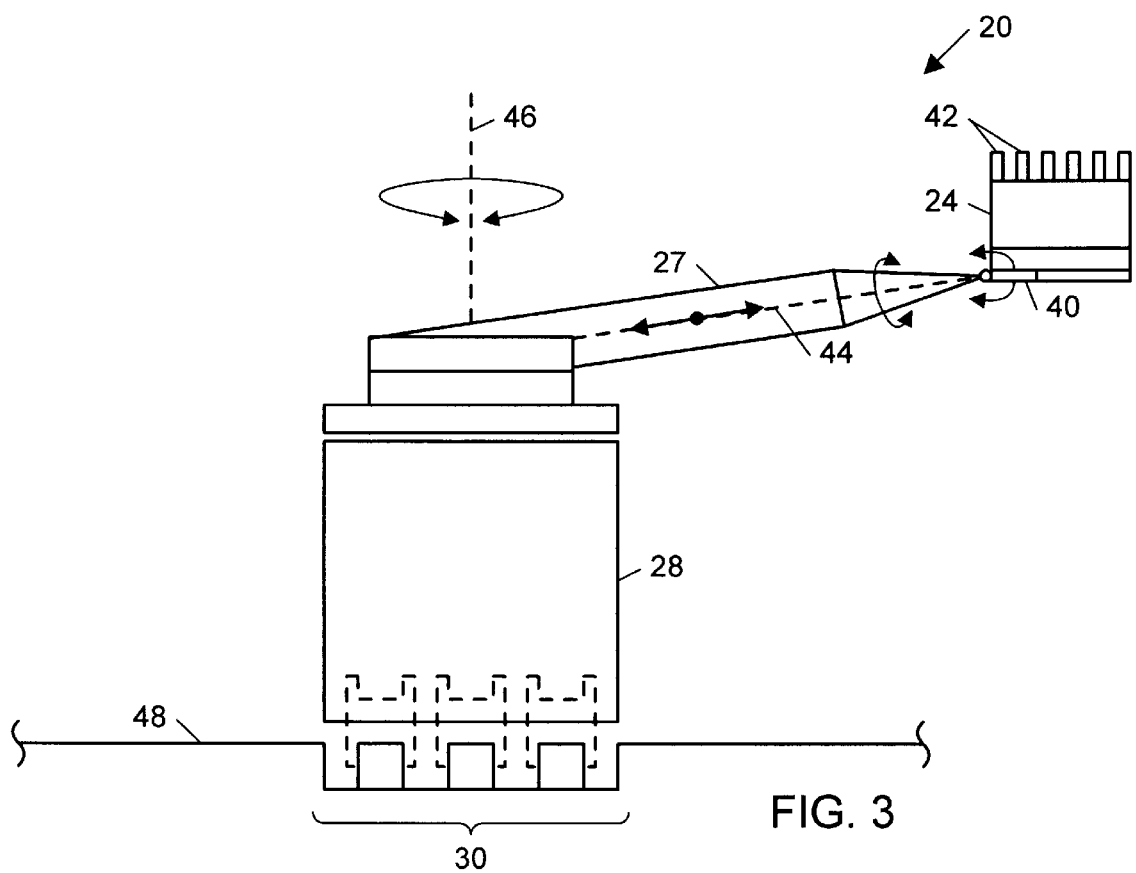
FIG. 3 is a side elevation view of a preferred embodiment of each robotic arm of FIG. 1, wherein each robotic arm includes an articulated mechanical arm mounted upon a vehicle, and wherein the mechanical arm includes a mechanical hand for grasping a container.

FIG. 3 is a side elevation view of a preferred embodiment of each robotic arm 20 including an articulated mechanical arm 27 mounted upon a vehicle 28. Mechanical arm 27 includes a mechanical hand 40 for grasping a container 24. Container 24 may contain semiconductor wafers 42 as shown, or may be empty. Mechanical hand 40 is joined to mechanical arm 27 at a hinge joint which allows movement of mechanical hand 40 about an axis. Mechanical arm 27 may be extended and retracted along a longitudinal axis 44, as well as rotated about longitudinal axis 44. Mechanical arm 27 may also be rotated about a vertical axis 46 through the center of vehicle 28. As described above, vehicle 28 preferably moves along a set of rails 30. Set of rails 30 is preferably positioned below a floor level 48 as shown.

Figure 4:
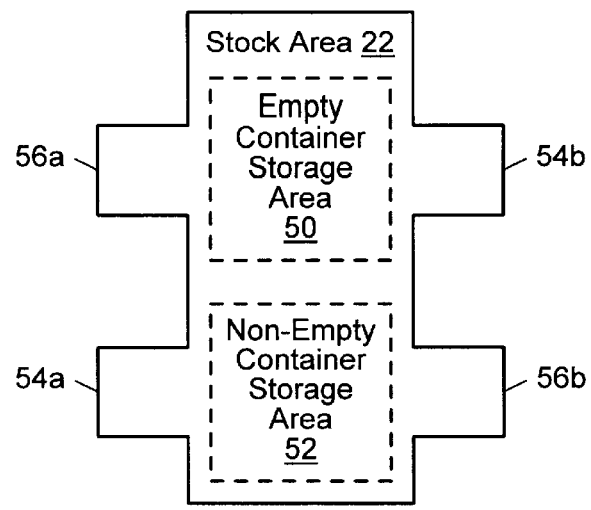
FIG. 4 is a top plan view of a preferred embodiment of each stock area of FIG. 1.

FIG. 4 is a top plan view of a preferred embodiment of each stock area 22. Each stock area 22 includes an empty container storage area 50 and a non-empty container storage area 52. Each stock area 22 also has two input ports 54a–b and two output ports 56a–b on opposite sides. Each stock area 22 also includes a transport system which transfers containers between the ports (i.e., input ports 54a–b and output ports 56a–b) and the container storage areas (i.e., empty container storage area 50 and non-empty container storage area 52). Empty containers are stored in empty container storage area 50 and containers containing wafers are stored in non-empty container storage area 52. Containers are received by each stock area 22 at input ports 54a–b. Each input port 54 has a sensor which senses the presence or absence of one or more wafers within a received container. If the received container is empty, the container is stored within empty container storage area 50 via the transport system. If the received container contains one or more wafers, the received container is stored within non-empty storage area 52 via the transport system. Upon request, containers stored within each stock area 22 are provided at output ports 56a–b via the transport system.

Figure 5:
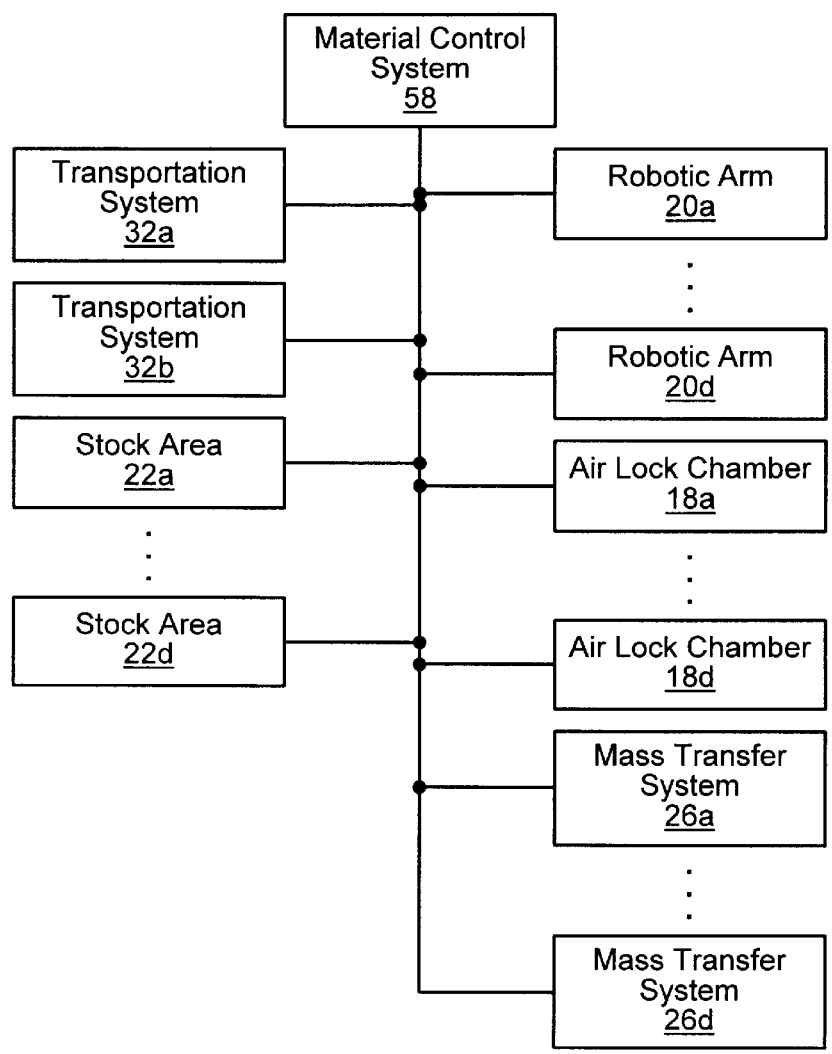
FIG. 5 is a block diagram of a preferred embodiment of a control system which governs the operation of the automated wafer transfer system of FIG. 1.

FIG. 5 is a block diagram of a preferred embodiment of a control system which governs the operation of the automated wafer transfer system 10. A material control system 58 controls all movements of semiconductor wafers between first fabrication area 14 and second fabrication area 16. Material control system 58 controls the operations of robotic arms 20a–d, air lock chambers 18a–d, mass transfer systems 26a–d, stock areas 22a–d, and transportation systems 32a–b, via control signals. Robotic arms 20a–d, air lock chambers 18a–d, mass transfer systems 26a–d, stock areas 22a–d, and transportation systems 32a–b regularly report their operational status to material control system 58.

In addition, material control system 58 governs the dispersal of empty and non-empty containers within each fabrication area and among all of the fabrication areas. Empty and non-empty containers within a given fabrication area are substantially evenly distributed between the stock areas within the fabrication area in order to reduce the total number of containers and the required sizes of the respective empty and non-empty container storage areas within the stock areas. Movements of empty and non-empty containers are accomplished such that empty and non-empty containers do not accumulate within a small portion of the total number of fabrication areas.

An example will now be used to describe the operation of automated wafer transfer system 10. Assume a group of semiconductor wafers arranged within a single container are to be transported from first fabrication area 14 to second fabrication area 16. Material control system 58 plans the transfer, deciding that stock areas 22a and 22c, robotic arms 20a and 20c, and air lock chamber 18a with mass transfer system 26a will be involved in the transfer. Doors 38a–b of air lock chamber 18a are both closed at the beginning of the transfer operation. Material control system 58 issues a command to transportation system 32a to deliver the wafer-containing container to stock area 22a. Upon receipt of the wafer-containing container from transportation system 32a at an input port, stock area 22a notifies material control system 58 and stores the wafer-containing container within non-empty storage area 52.

An empty container will be required to receive the wafers within second fabrication area 16. If stock area 22c does not contain an empty container, material control system locates a suitable empty container within second fabrication area 16 and directs transportation system 32b to deliver the empty container to stock area 22c. Upon receipt of the empty container from transportation system 32b at an input port, stock area 22c notifies material control system 58 and stores the empty container within empty container storage area 50.

Once stock area 22a has received the wafer-containing container, material control system 58 directs stock area 22a to provide the wafer-containing container at an output port on a side of stock area 22a closest to robotic arm 20a. Material control system 58 directs robotic arm 20a to pick up the wafer-containing container and place it within mass transfer system 26a of air lock chamber 18a. Material control system 58 simultaneously directs air lock chamber 18a to open door 38a in operational side 36a which allows access to the interior of air lock chamber 18 from first fabrication area 14. Once robotic arm 20a has placed the wafer-containing container within mass transfer system 26a, mass transfer system 26a removes the wafers from the container and places the wafers within the temporary storage location. Robotic arm 20a then removes the container, now empty, from air lock chamber 18a, and door 38a is closed. Robotic arm 20a delivers the empty container to an input port of stock area 22a closest to robotic arm 20a. Stock area 22a stores the empty container within empty container storage area 50.

At this time doors 38a–b of air lock chamber 18a are both in the closed position. A period of time is allowed to elapse within which all of the air present within air lock chamber 18a is exhausted and replaced by filtered air provided through the upper surface of air lock chamber 18a as described above. In the preferred embodiment, this amount of time is about 30 seconds. This purging step helps prevent any airborne contaminants introduced into air lock chamber 18a from first fabrication area 14 when door 38a was open from being transferred to second fabrication area 16 when door 38b is subsequently opened.

During the time the air within air lock chamber 18a is being purged, material control system 58 issues a command to stock area 22c to provide the necessary empty container at an output port on a side of stock area 22c closest to robotic arm 20c. Material control system 58 then directs robotic arm 20c to pick up the empty container and place it within mass transfer system 26a of air lock chamber 18a. Material control system 58 simultaneously directs air lock chamber 18a to open door 38b in operational side 36b which allows access to the interior of air lock chamber 18 from second fabrication area 16. Once robotic arm 20c has placed the empty container within mass transfer system 26a, mass transfer system 26a removes the wafers from the temporary storage location and places the wafers within the container. Robotic arm 20c then removes the container, now containing the wafers, from air lock chamber 18a, and door 38b is closed. Robotic arm 20c delivers the wafer-containing container to an input port of stock area 22c closest to robotic arm 20c. Stock area 22c stores the wafer-containing container within non-empty storage area 52.

It is noted that four air lock chambers 18a–d are available for wafer transfer operations. Material control system 58 is capable of controlling wafer transfer operations involving multiple air lock chambers in order to improve the number of wafers transferred in a given period of time (i.e., wafer transfer throughput). For example, multiple containers may be transferred from first fabrication area 14 to second fabrication area 16 using stock areas 22a and 22c, robotic arms 20a and 20c, and air lock chambers 18a and 18b with respective mass transfer systems 26a and 26b. Following transfer of wafers within a first wafer-containing container to mass transfer system 26a of air lock chamber 18a, robotic arm 20a may place a second wafer-containing container within mass transfer system 26b of air lock chamber 18b while the air within air lock chamber 18a is being purged. As a result, the number of wafers transferred in a given amount of time is increased. Additional wafer transfer resources (e.g., air lock chambers, robotic arms, and stock areas) may also be employed in order to increase wafer transfer throughput.

Automated wafer transfer system 10 is also capable of operating in "degraded" modes when one or more of the wafer transfer resources are inoperative. For example, if robotic arm 20a is inoperative, material control system 58 may direct robotic arm 20b to accomplish all container transfers between stock areas 22a–b and air lock chambers 18a–d. If robotic arms 20a–b are both inoperative, material control system 58 is able to coordinate wafer transfer operations involving the manual transfer of wafers between stock areas 22a–b and air lock chambers 18a–18d.

It will be appreciated to those skilled in the art having the benefit of this disclosure that this invention is believed to be an automated system for performing containerless transfer of semiconductor wafers through a wall between a first fabrication area and a second fabrication area. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A system for transferring a semiconductor wafer from a first fabrication area to a second fabrication area, comprising:

a plurality of containers adapted for holding semiconductor wafers dispersed within the first fabrication area, wherein a portion of the plurality of containers are wafer-containing containers containing a semiconductor wafer, and wherein the remainder of the plurality of containers are empty containers absent semiconductor wafers;

an air lock chamber placed within a sealed opening in a wall separating the first fabrication area from the second fabrication area, wherein the air lock chamber comprises a first door and a second door arranged on opposed surfaces of the air lock chamber, and wherein the first door separates the first fabrication area from the air lock chamber;

a mass transfer system positioned within said air lock chamber, wherein sad mass transfer system is operated to remove the semiconductor wafer from a wafer-containing container and to store the semiconductor wafer within the air lock chamber;

a plurality of stock areas located within the first fabrication area, wherein each stock area is configured to store the wafer-containing containers and the empty containers, and wherein the plurality of stock areas includes a first stock area positioned adjacent to the first door of the air lock chamber;

a control system which controls the operations of the air lock chamber, the mass transfer system, the plurality of stock areas, and the robotic arm, wherein the control system governs the dispersal of empty containers within the first fabrication area such that each of the plurality of stock areas contains substantially the same number of empty containers.

2. The system as recited in claim 1, wherein said second door separates the second fabrication area from the air lock chamber.

3. The system as recited in claim 1, wherein the first fabrication area is hermetically sealed from the second fabrication area during times when said first door is closed.

4. The system as recited in claim 1, wherein the first fabrication area is hermetically sealed from the second fabrication area during times when said second door is closed.

5. The apparatus as recited in claim 1, wherein the air pressure within the air lock chamber is maintained at a level higher than the air pressure levels within the first and second fabrication areas.

6. The system as recited in claim 1, wherein air within the air lock chamber is exhausted and replaced by filtered supply air during a time period when both the first and second doors are closed.

7. The system as recited in claim 1, wherein the plurality of containers comprise wafer boats.

8. A system for transferring a semiconductor wafer from a first fabrication area to a second fabrication area, comprising:

a plurality of containers dispersed within the first and second fabrication areas, wherein a first subset of the plurality of containers contain a semiconductor wafer, and wherein a second subset of the plurality of containers are absent wafers;

an air lock chamber placed within a sealed opening in a wall separating the first fabrication area from the second fabrication area, wherein the air lock chamber comprises a first door and a second door arranged on opposed surfaces of the air lock chamber, and wherein the first door separates the first fabrication area from the air lock chamber, and wherein the second door separates the second fabrication area from the air lock chamber, and wherein the first and second doors are in communication with each other;

a mass transfer system positioned within said air lock chamber, wherein said mass transfer system is operated to remove a semiconductor wafer from a first container drawn from the first subset, to store the semiconductor wafer, and to provide the semiconductor wafer to a second container drawn from the second subset;

a first and a second stock area each configured to store a portion of said plurality of containers drawn from either said first or said second subset, wherein the first stock area is positioned adjacent to the first door of the air lock chamber and the second stock area is positioned adjacent to the second door of the air lock chamber;

a first and a second robotic arm, wherein the first robotic arm is positioned between the first door of the air lock chamber and the first stock area and operated to move containers between the air lock chamber and the first stock area, and wherein the second robotic arm is positioned between the second door of the air lock chamber and the second stock area and operated to move containers between the air lock chamber and the second stock area; and a control system which controls the operations of the first and second robotic arms, the air lock chamber, the mass transfer system, and the first and second stock areas, and wherein the control system governs the dispersal of the plurality of containers within the first and second fabrication areas such that the first and second stock areas each contain a substantially equal number of containers drawn from the second subset.

9. The system as recited in claim 8, wherein the first fabrication area is hermetically sealed from the second fabrication area during times when said first door is closed.

10. The system as recited in claim 8, wherein the first fabrication area is hermetically sealed from the second fabrication area during times when said second door is closed.

11. The system as recited in claim 8, wherein the air pressure within the air lock chamber is maintained at a level higher than the air pressure levels within the first and second fabrication areas.

12. The system as recited in claim 8, wherein air within the air lock chamber is exhausted and replaced by filtered supply air during a time period when both the first and second doors are closed.

* * * * *

UNITED STATES PATENT AND TRADEMARK OFFICE
CERTIFICATE OF CORRECTION

PATENT NO. : 5,924,833
DATED     : July 20, 1999
INVENTOR(S) : Conboy, et al

It is certified that error appears in the above-identified patent and that said Letters Patent is hereby corrected as shown below:

In the Claims:

Claim 1, col. 10, line 9, after the phrase "chamber, wherein" please delete "sad" and substitute therefor --said--.

Col. 10, between line 18 & 19, after the phrase "air lock chamber;" please insert the following paragraph --a robotic arm positioned between the first door and the first stock area, wherein the robotic arm is operated to move both the wafer-containing containers and the empty containers between the air lock chamber and the first stock area; and--

Signed and Sealed this

Fourth Day of January, 2000

*Attest:*

*Attesting Officer*          *Acting Commissioner of Patents and Trademarks*